United States Patent
Chao et al.

(10) Patent No.: US 6,624,523 B2
(45) Date of Patent: Sep. 23, 2003

(54) STRUCTURE AND PACKAGE OF A HEAT SPREADER SUBSTRATE

(75) Inventors: Shin-Hua Chao, Kaohsiung (TW); Kuan-Neng Liao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 61 days.

(21) Appl. No.: 09/882,012

(22) Filed: Jun. 15, 2001

(65) Prior Publication Data

US 2002/0053731 A1 May 9, 2002

(30) Foreign Application Priority Data

Nov. 8, 2000 (TW) .................... 89123557 A

(51) Int. Cl.[7] ............... H01L 23/48; H01L 29/40
(52) U.S. Cl. .............. 257/796; 257/738; 257/783; 257/784; 257/693; 257/710; 257/712; 257/706; 257/707; 257/708; 257/709; 257/711; 257/713; 257/714; 257/715; 257/716; 257/717; 257/718; 257/719; 257/720; 257/722; 257/721
(58) Field of Search ............... 257/796, 738, 257/783, 784, 693, 706–722

(56) References Cited

U.S. PATENT DOCUMENTS

| | | | |
|---|---|---|---|
| 5,397,921 A | | 3/1995 | Karnezos |
| 5,420,460 A | | 5/1995 | Massingill |
| 5,909,056 A | * | 6/1999 | Mertol ................ 257/704 |
| 5,952,719 A | * | 9/1999 | Robinson et al. ....... 257/737 |
| 5,972,734 A | * | 10/1999 | Carichner et al. ....... 438/106 |
| 6,020,637 A | | 2/2000 | Karnezos |
| 6,084,297 A | * | 7/2000 | Brooks et al. .......... 257/698 |
| 6,249,053 B1 | * | 6/2001 | Nakata et al. .......... 257/738 |

FOREIGN PATENT DOCUMENTS

JP  406097355 A  *  4/1994

* cited by examiner

Primary Examiner—Allan R. Wilson
Assistant Examiner—Joseph Nguyen
(74) Attorney, Agent, or Firm—J. C. Patents

(57) ABSTRACT

A structure of a heat spreader substrate. A first heat spreader has a first upper surface, a corresponding first lower surface and an opening. A second heat spreader has a second upper surface and a corresponding second lower surface. The second heat spreader is fit tightly into the opening. The second lower surface and the first lower surface are coplanar. A thickness of the second heat spreader is smaller than that of the first heat spreader. A chip is located on the second upper surface. A substrate is located on the first upper surface of the first heat spreader, and the opening is exposed by the substrate.

21 Claims, 5 Drawing Sheets

STRUCTURE AND PACKAGE OF A HEAT SPREADER SUBSTRATE

CROSS REFERENCE TO RELATED APPLICATION

This application claims the priority benefit of Taiwan application serial no. 89123557, filed on Nov. 8, 2000.

1. Field of the Invention

The present invention relates to a structure and package of a heat spreader substrate. More specifically, the present invention relates to a cavity down package.

2. Description of the Related Art

With the rapid development in integrated circuits and continuous improvement in semiconductor devices, an important feature of a semiconductor is to have high efficiency, high integration, high speed and to be a multi-functional device. Moreover, the packaging quality of this device is becoming more demanding. For example, high density, high heat diffusion functions and high reliability are very important factors in the development of semiconductor packaging.

FIG. 1 is a schematic cross-sectional view showing a structure of a cavity down ball grid array (BGA). The structure of a cavity down BGA 20 is disclosed in U.S. Pat. No. 5,420,460 and U.S. Pat. No. 5,397,921. The carrier comprises a heat spreader 22 and a substrate 26. The heat spreader 22 is adhered on the substrate 26 by an adhesive material 28. A cavity 24 is formed on the middle of the heat spreader 22 and is used to carry a chip 40. A patterned trace layer and an insulating layer are laminated on the substrate. A mounting pad 30 and a ball pad 32 are formed on the surface of the patterned trace layer, and a solder mask 34 covers the surface of the patterned trace layer. The chip 40 comprises an active surface 40a and a backside 40b. The backside 40b of the chip 40 is adhered on the bottom of the cavity 24 by an adhesive material 36. A bonding pad 42, which is formed on the active surface 40a of the chip, is connected to the mounting pad 30 of the substrate 26 by gold wires 50. A molding compound 52 covers the chip 40, gold wires 50 and the mounting pad 30. A solder ball 54 is formed on the surface of the ball pad 32.

FIG. 2 is a schematic, cross-sectional view showing another structure of a cavity down BGA. The cavity down BGA package is disclosed in U.S. Pat. No. 6,020,637. The carrier is made of a heat spreader 102, a ground plane 104 and a flex substrate 110. The heat spreader 102, the ground plane 104 and the flex substrate 110 are stacked on each other with insulating adhesive materials 106 and 108. A cavity is formed on the middle of the ground plane 104 and the flex substrate 110 to carry a chip 120. The flex substrate 110 is a flex tape interconnect substrate. A patterned trace layer and a polyimide layer are laminated on the flex tape interconnect substrate. A mounting pad and a ball pad are formed on the surface of the patterned trace layer 112. A solder mask 114 covers the surface of the patterned trace layer 112. The chip 120 has an active surface 120a and a backside 120b. The backside 120b of the chip 120 is adhered on the bottom of the cavity by an adhesive material 124. The bonding pad 122 of the active surface 120a is connected to a ground ring 116 of the ground plane 104 and to the mounting pad of the flex substrate 110. The chip 120, the gold wires 126 and the mounting pad are encapsulated with a mounting compound 128. A solder ball 130 is formed on the surface of the ball pad 112.

According to the above, a heat spreader is the main structure of the carrier. The heat spreader is made of copper, and the copper improves the heat diffusion of the package material.

Referring to FIG. 1, the cavity 24 of the heat spreader 22 is formed by an etching process. However, the etching process has a high cost, low throughput and is time consuming. On the other hand, the structure of the heat spreader is limited to its thickness because it is difficult to reduce the thickness by utilizing the conventional method. In FIG. 2, the heat spreader is made of two metals, a heat spreader 102 and a ground plane 104. Although the cavity can be mass produced by a machining method, the structure is still limited to a certain thickness after it is stacked up. Thus, the disadvantage of the conventional method is the lack of control of the thickness of the package.

SUMMARY OF THE INVENTION

It is an object of the present invention to provide a heat spreader substrate and the package thereof to reduce the thickness of the packaging.

It is another object of the present invention to provide a machining method and a process for producing a heat spreader substrate and a package to reduce the cost.

According to the present invention, a structure of a heat spreader substrate is provided. A first heat spreader has a first upper surface, a first lower surface and an opening. A second heat spreader has a second upper surface and a second lower surface. A thickness of the second heat spreader is smaller than a thickness of the first heat spreader. The second heat spreader is fit tightly into the opening. The second lower surface of the second heat spreader and the first lower surface of the first heat spreader are coplanar. The upper surface of the second heat spreader is for locating a chip. The substrate is located on the upper surface of the first heat spreader, and the opening is exposed.

To achieve the foregoing and other objects and in accordance with the purpose of the present invention, the second heat spreader of the invention can be designed into various shapes, such as a first portion of the second heat spreader being bigger than a second portion of the second heat spreader. The molding compound is utilized to fill a space between the first heat spreader and the second heat spreader in order to increase the adhesion during the molding process. A groove and a protrusion are formed respectively on a contact portion between the first heat spreader and the second heat spreader.

The purpose of forming the groove and the protrusion is to provide a secure fit for the second heat spreader into the first heat spreader. A chip is located on the cavity surface. A plurality of loop-shaped grooves are formed on the second upper surface.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
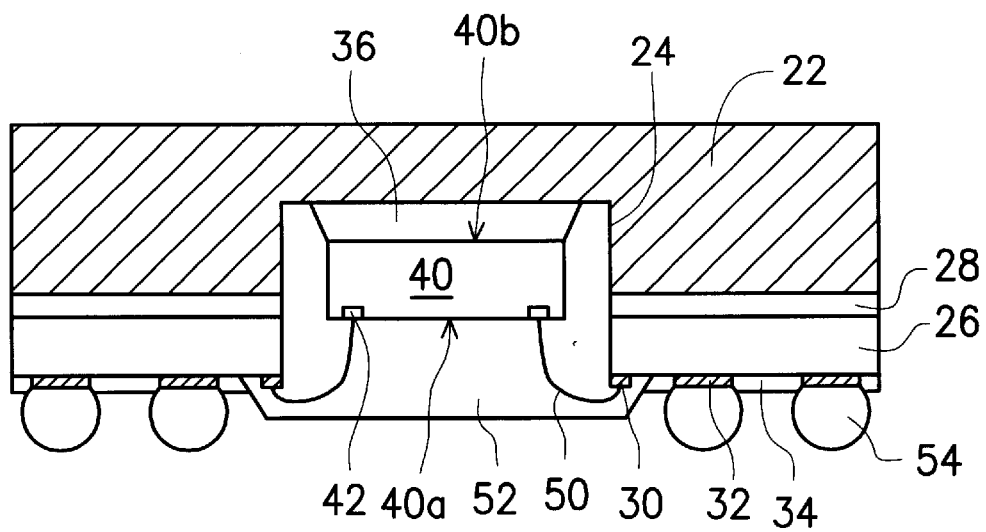
FIG. 1 is a schematic cross-sectional view of a conventional structure of a cavity down BGA.
Figure 2:
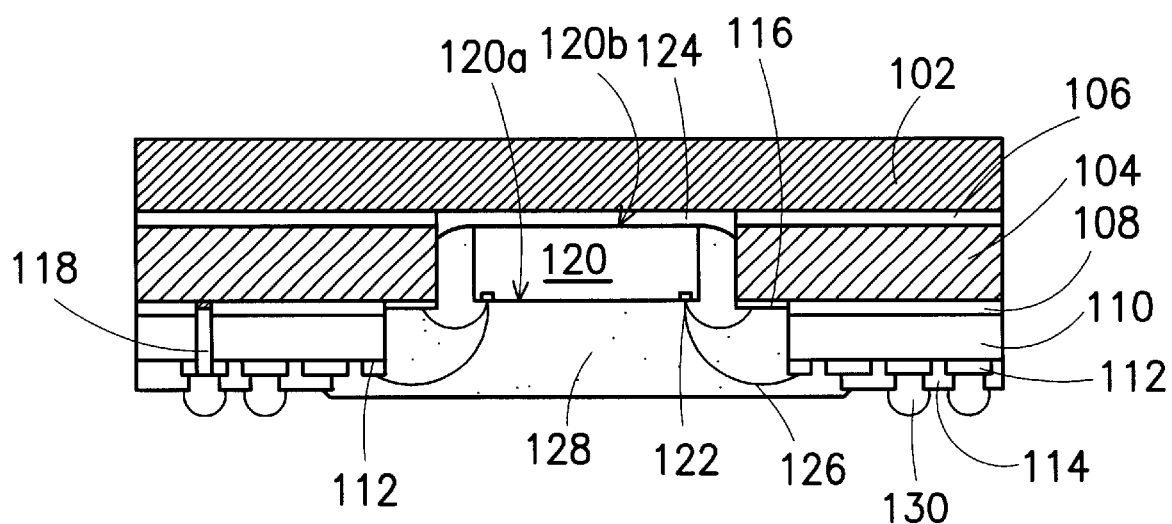
FIG. 2 is a schematic cross-sectional view of another conventional structure of a cavity down BGA.
Figure 3:
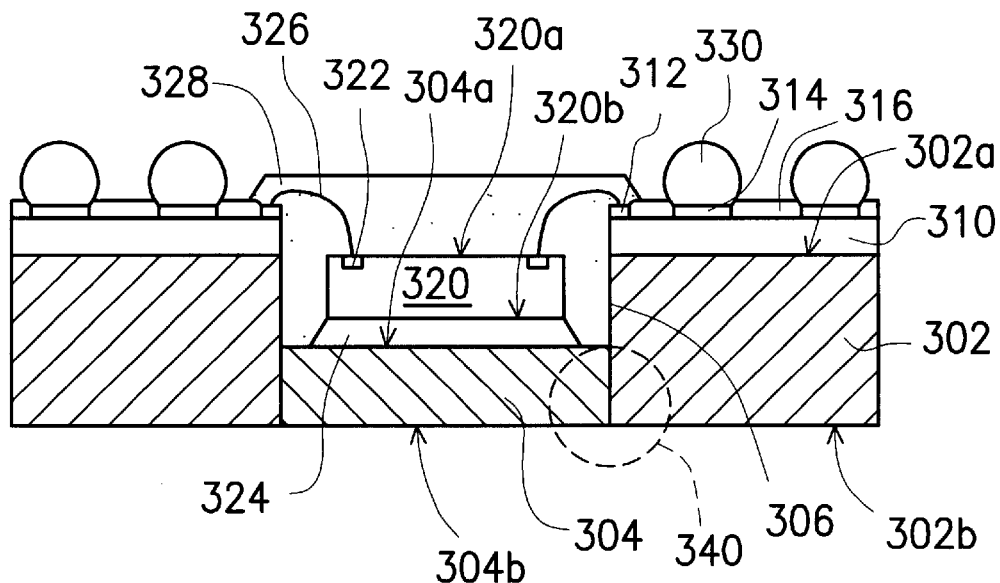
FIG. 3 is a schematic cross-sectional view of a semiconductor in a packaging process according to a first embodiment of the present invention.

Referring to FIG. 3, a schematic, cross-sectional view showing a first embodiment of the present invention is provided. The semiconductor package 300 of the present invention is a cavity down BGA type of package. A heat spreader substrate is used as a carrier in the packaging structure of the embodiment according to the present invention. The heat spreader substrate comprises a first heat spreader 302, a second heat spreader 304 and the substrate 310. The first heat spreader 302 consists of a first upper surface 302a, a corresponding first lower surface 302b and an opening 306. A second heat spreader 304 comprises a second upper surface 304a and a corresponding second lower surface 304b. The second heat spreader 304 is fit tightly into the opening 306. The second lower surface 304b of the second heat spreader 304 and the first lower surface 302b of the first heat spreader 302 are coplanar, and a thickness of the second heat spreader 304 is smaller than a thickness of the first heat spreader 302. Due to this arrangement between the first heat spreader 302 and the second heat spreader 304, a cavity is formed.

The substrate 310 is adhered on the first upper surface 302a by an insulating adhesive material (not shown). The substrate is a flex tape interconnected substrate, for example. A patterned trace layer and a polyimide layer are laminated on the flex tape interconnected substrate. A mounting pad 312 and a ball pad 314 are formed on the patterned trace layer. A solder mask 316 covers the patterned trace layer. A chip 320 is located on the second upper surface 304a of the second heat spreader 304. The chip comprises an active surface 320a and a backside 320b. The backside 320b of the chip 320 is adhered on the second upper surface 304a by an adhesive material 324. A bonding pad 322, which is on the active surface 320a, is connected to the mounting pad 312 of the substrate 310 by conductive wires 326, for example golden wires or aluminum wires. The chip 320, conductive wires 326 and the mounting pad 312 are encapsulated with a molding compound 328. A solder ball 330 is formed on the surface of the ball pad 314.

According to the above, the opening 306 and the first heat spreader 302 can be fabricated by a punching method, for example. The second heat spreader 304 is fabricated by a machining method instead of an etching method. For these reasons, the productivity is increased, the cost of the whole fabrication can be reduced substantially. The shape of the heat spreaders can be varied in accordance with the increasing mounting ability between the two heat spreaders of the substrate and the molding compound. The structure of the second heat spreader is not limited to a specific shape; therefore, it can be designed into a square shape or a rectangle shape, for example.

Figure 4:
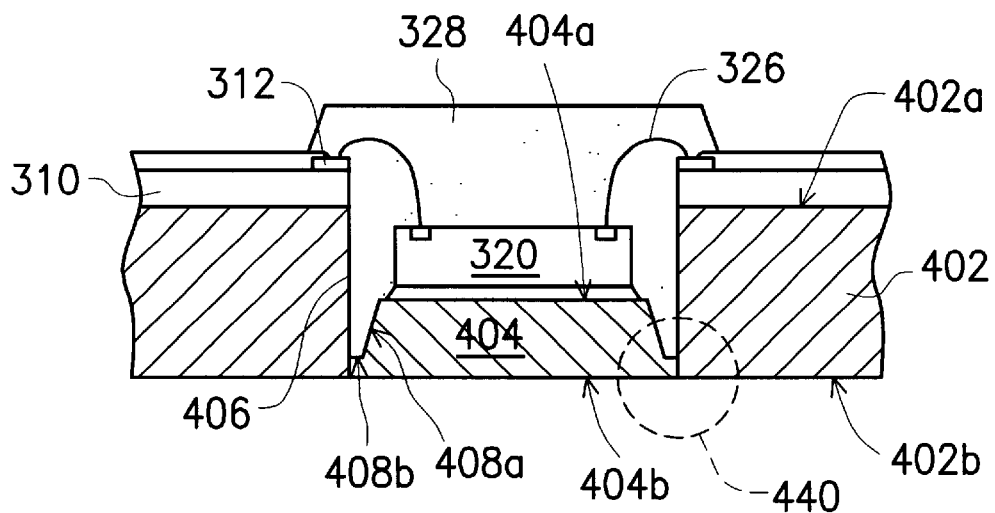
FIG. 4 is a schematic cross-sectional view of a heat spreader substrate according to a second embodiment of the present invention.

Referring to FIG. 4, a cross-sectional view of a heat spreader substrate according to a second embodiment of the present invention is provided. The shape of the heat spreader structures can be varied in accordance with the increasing mounting ability between the two heat spreaders of the substrate and the molding compound. In FIG. 4, a first heat spreader 402 of the heat spreader substrate has a first upper surface 402a, a corresponding second lower surface 402b and an opening 406. A second heat spreader 404 has a second upper surface 404a and a corresponding lower surface 404b. The second heat spreader 404 is designed in a shape that comprises a first portion 408a and a second portion 408b. A thickness of the first portion 408a of the second heat spreader 404 is larger than a thickness of the second portion 408b, and the second portion 408b of the second heat spreader 404 is in contact with the first heat spreader 402. The second heat spreader is designed in such a way that an area of second upper surface 404a is smaller than the area of the second lower surface 404b. The second heat spreader 404 is fit tightly in the opening 406. The second lower surface 404b of the second heat spreader 404 and the first lower surface 402b of the first heat spreader 402 are coplanar. The design of the present invention can allow the molding compound 328 to fill in the opening 406 and a space between the first heat spreader 402 and the second heat spreader 404 during a molding process. The contact area between the molding compound 328 and the first heat spreader 402 is increased, and the contact area between the molding compound 328 and the second heat spreader 404 also are increased. The mounting ability is thus improved. However, the heat spreaders of the present invention are not limited to one shape or one design.

Figure 5:
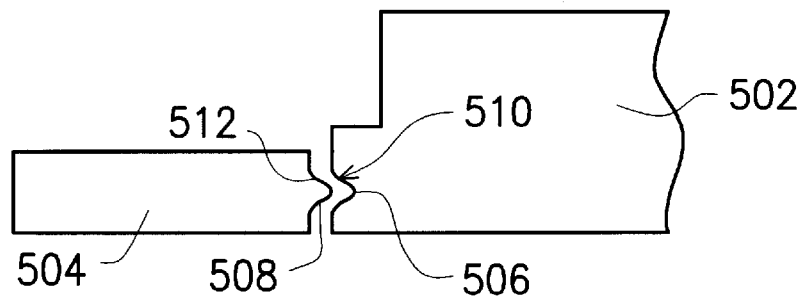
FIG. 5 is a schematic magnified view of a portion of a heat spreader substrate according to a third embodiment of the present invention.

Referring to FIG. 5, a magnified view of a portion of the heat spreader substrate of a third embodiment is provided. The structure of a contact portion can be changed to increase the mounting ability between the first heat spreader and the second heat spreader. FIG. 5 is a schematic magnified view of a portion that corresponds to the region 340 of FIG. 3 or to the region 440 of FIG. 4. From the above-mentioned, the second heat spreader 404 is fit tightly in the opening 406, and the second portion 408b of the second heat spreader 404 is in contact with a contact portion of the first heat spreader 402. Therefore, various shapes and structures of the heat spreaders and the contact portions are designed according to the increasing of mounting ability between the two heat spreaders of the substrate and the molding compound. A groove 506 is formed on a contact portion 510 of the first heat spreader 502. A protrusion 508 is formed on a contact portion 512 of the second heat spreader 504 that is in contacted with the first heat spreader 502. The protrusion 508 fits into the groove 506. During integration, the protrusion 508 fits into the groove 506 to allow the first heat spreader 502 to be mounted tightly with the second heat spreader 504.

Figure 6:
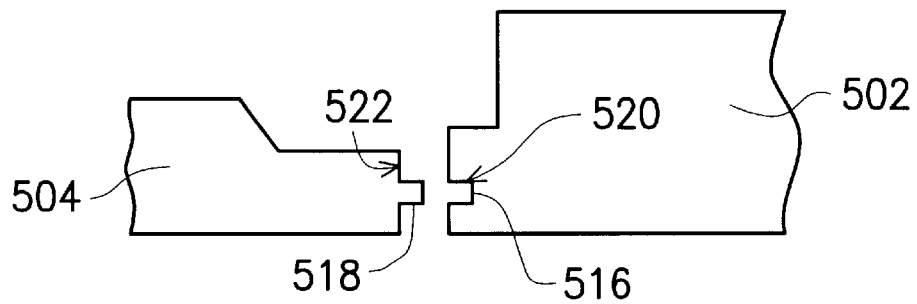
FIG. 6 is another schematic magnified view of a portion of the heat spreader substrate of the third embodiment.

Referring to FIG. 6, another schematic magnified view of a portion of the heat spreader substrate of the third embodiment is provided. A square-shaped groove 516 is formed on a contact portion 520 of the first heat spreader 502. A square-shaped protrusion 518 is formed on a contact portion 522 of the second heat spreader 504. The shape of the groove 516 corresponds to the shape of the protrusion 518, and the protrusion 518 fits into the groove 516 during integration. The first heat spreader 502 and the second heat spreader 504 are then mounted tightly with each other.

Figure 7:
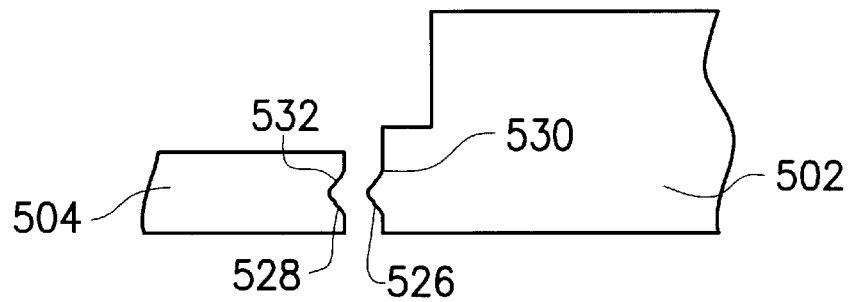
FIG. 7 is a schematic magnified view corresponding to FIG. 5.
Figure 8:
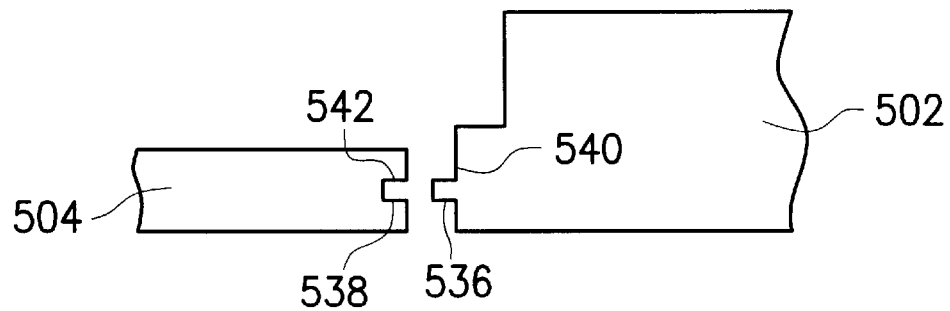
FIG. 8 is a schematic magnified view corresponding to FIG. 6.

Referring to FIG. 7 and FIG. 8, schematic magnified views of another type of groove and protrusion are shown that respectively correspond to FIG. 5 and FIG. 6. According to the above, the groove is formed on a contact portion of the first heat spreader, and the protrusion is formed on a contact portion of the second heat spreader. However, the structure and the position of the protrusion and the groove can be reversed.

The positions of the groove and the protrusion in FIG. 7 are reversed from that in FIG. 5. A protrusion 526 is formed on a contact portion 530 of the first heat spreader 502. A groove 528 is formed on a contact portion 532 of the second heat spreader 504. The protrusion 526 fits into the groove 528 during the integration process. The first heat spreader 502 and the second heat spreader 504 are mounted tightly with each other. Similarly, the positions of the groove and the protrusion in FIG. 8 are reversed from that in FIG. 6. A protrusion 536 is formed on a contact portion 540 of the first heat spreader 502. A groove 538 is formed on a contact portion 542 of the second heat spreader 504. The protrusion 536 fits into the groove 538; thus, the first heat spreader 532 and the second heat spreader 534 are mounted tightly with each other.

Figure 9:
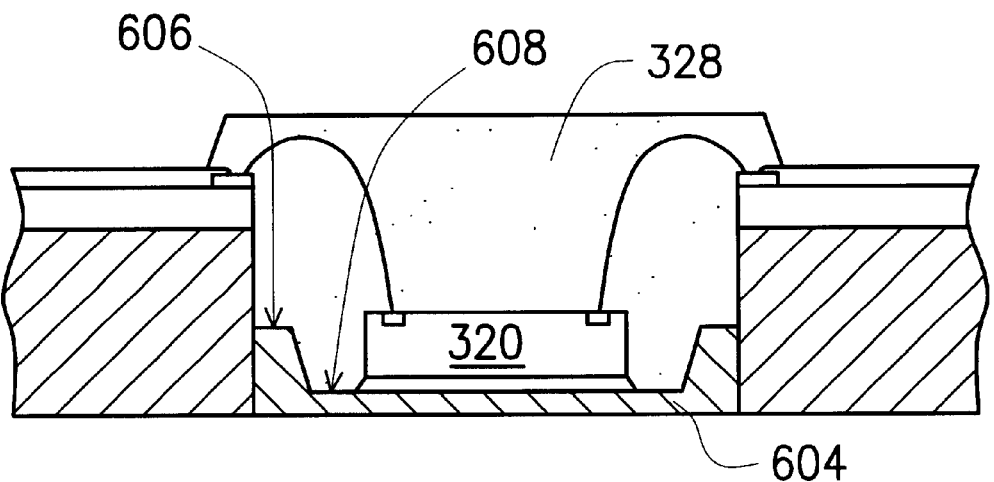
FIG. 9 is a schematic cross-sectional view of a heat spreader substrate according to a fourth embodiment of the present invention.

Referring to FIG. 9, a schematic cross-sectional view of a heat spreader substrate according to a fourth embodiment of the present invention is provided. The structure of the heat spreaders of the present invention is not limited to the above-mentioned embodiments. Therefore the structure of the heat spreaders can be varied according to the improvement of the mounting ability of the space between the two heat spreaders of the heat spreader substrate and the packaging material.

Apart from the above-mentioned method, other methods can also improve the mounting ability. Referring to FIG. 9, a second heat spreader 604 comprises a first portion 608 and a second portion 606. The first portion 608 has a thickness smaller than a thickness of the second portion 606. A chip 320 is adhered on a surface of the first portion 608 of the second heat spreader 604. The molding compound 328 is used to fill the opening between the first heat spreader and the second heat spreader during the encapsulation process. A contact area between the molding compound 328 and the second heat spreader 604 increases, and the mounting ability is improved.

Figure 10:
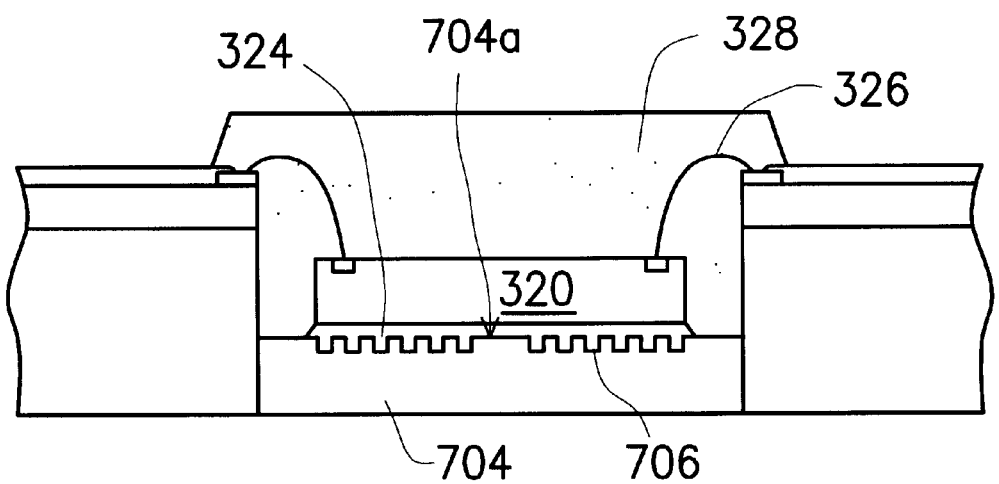
FIG. 10 is a schematic cross-sectional view of a heat spreader substrate according to a fifth embodiment of the present invention.
Figure 11:
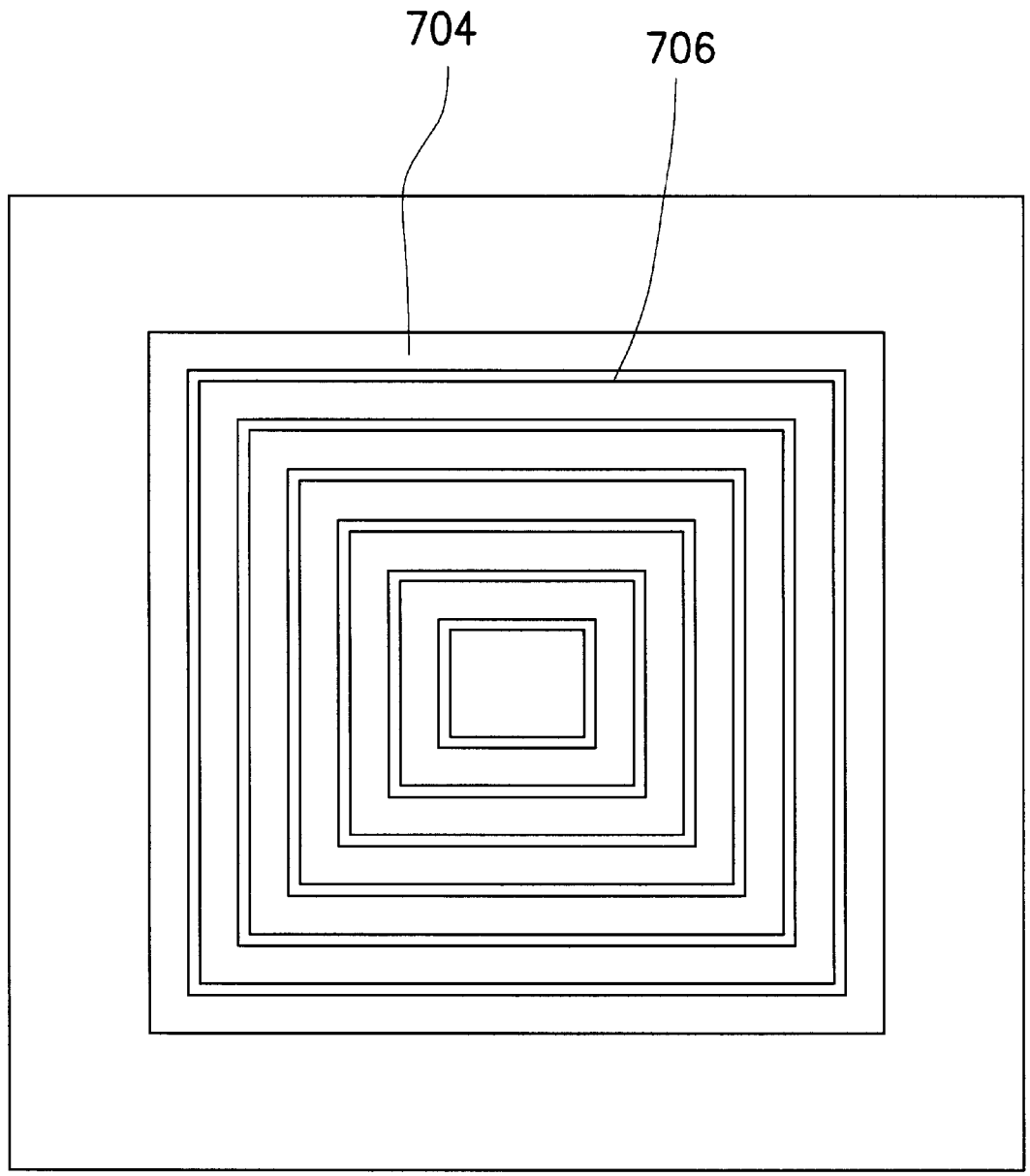
FIG. 11 is a schematic top view of the second heat spreader 704 of FIG. 10.

FIG. 10 is a schematic cross-sectional view of a heat spreader substrate according to a fifth preferred embodiment of the present invention. FIG. 11 is a schematic top view of the second heat spreader 704 of FIG. 10. A plurality of grooves 706 can be formed on the second surface 704a of the second heat spreader 704 to improve the mounting ability between the chip and the heat spreader substrate, for example, the loop shape grooves shown in FIG. 11. This design allows the adhesive material 324 to fill in the grooves 706 during the die attaching process. Therefore the contact area of the adhesive material 324 and the second heat spreader 704 increases, and the mounting ability is improved.

In view of the foregoing, the structure and package of a heat spreader substrate of the present invention comprises two heat spreaders. The second heat spreader is fit into an opening of the first heat spreader. The opening and the first heat spreader are fabricated by a punching method, for example. The second heat spreader is fabricated by a machining method instead of an etching method. The fabrication can be used for mass production. For these reasons, the productivity is increased, and the cost of the whole fabrication can be reduced substantially.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A structure of a heat spreader substrate comprising:
   a first heat spreader having a first upper surface, a first lower surface;
   a second heat spreader having a second upper surface and a second lower surface, tightly attached to the first heat spreader so that a cavity opening is formed, wherein the second lower surface and the first lower surface are coplanar, a groove is formed on a contact portion of the first heat spreader, and a protrusion that fits to the groove is formed on a contact portion of the second heat spreader; and
   a substrate located on the first upper surface, wherein the opening of the first heat spreader is exposed.

2. A structure of a heat spreader substrate comprising:
   a first heat spreader having a first upper surface, a first lower surface;
   a second heat spreader having a second upper surface and a second lower surface, tightly attached to the first heat spreader so that a cavity opening is formed, wherein the second lower surface and the first lower surface are coplanar, a groove is formed on a contact portion of the second heat spreader, and a protrusion that fits to the groove is formed on a contact portion of the first heat spreader; and
   a substrate located on the first upper surface, wherein the opening of the first heat spreader is exposed.

3. The structure of claim 1, wherein the second heat spreader further comprises a first portion and a second portion, the first portion having a thickness larger than a thickness of the second portion, wherein the second portion is in contact with the first heat spreader.

4. The structure of claim 2, wherein a groove is formed on a contact portion of the first heat spreader, and a protrusion that fits to the groove is formed on the second portion of the second heat spreader.

5. The structure of claim 2, wherein a groove is formed on the second portion of the second heat spreader, and a protrusion that fits to the groove is formed on contact portion of the first heat spreader.

6. The structure of claim 1, wherein the second heat spreader further comprises a first portion and a second portion, the first portion having a thickness smaller than a thickness of the second portion, wherein the second portion is in contact with the first heat spreader.

7. The structure of claim 1, wherein a plurality of grooves are formed on the second upper surface.

8. The structure of claim 7, wherein the grooves are loop-shaped.

9. A package of a semiconductor comprising:
   a first heat spreader having a first upper surface, a corresponding first lower surface;
   a separate second heat spreader having a second upper surface and a second lower surface, tightly attached to the first heat spreader so that a cavity opening is formed, wherein the second lower surface and the first lower surface are coplanar, a groove is formed on a contact portion of the first heat spreader, and a protrusion that fits to the groove is formed on a contact portion of the second heat spreader;

a substrate located on the first upper surface, wherein the cavity opening is exposed;

a plurality of mounting pads formed on the substrate;

a chip having an active surface and a corresponding backside, wherein the backside of the chip is adhered on the second upper surface;

a plurality of bonding pads formed on the active surface, wherein the bonding pads are electrically connected to the mounting pads; and a molding compound that encapsulates the chip.

10. The package of claim 9, wherein the second heat spreader further comprises a first portion and a second portion, the first portion having a thickness larger than a thickness of the second portion, wherein the second portion is in contact with the first heat spreader.

11. The package of claim 9, wherein the second heat spreader further comprises a first portion and a second portion, the first portion having a thickness smaller than a thickness of the second portion, wherein the second portion is in contact with the first heat spreader.

12. The package of claim 9, wherein a plurality of grooves are formed on the second upper surface, and the chip is adhered on the second upper surface by an adhesive material, wherein the adhesive material can fill into the grooves.

13. The package of claim 12, wherein the grooves are loop-shaped.

14. The package of claim 9, wherein the substrate further comprises a plurality of ball pads, wherein the ball pads are for locating a plurality of solder balls.

15. A structure of a heat spreader substrate comprising:

a first heat spreader having a first upper surface, a first lower surface and an opening;

a separate second heat spreader having a second upper surface, and a second lower surface, wherein a thickness of the second heat spreader is smaller than a thickness of the first heat spreader, and the second heat spreader is fit tightly into the opening so that a cavity is defined by the first heat spreader and the second heat spreader, wherein the second lower surface and the first lower surface are coplanar so that a cavity is formed, and wherein a groove is formed on a contact portion of the first heat spreader, and a protrusion that fits to the groove is formed on a contact portion of the second heat spreader; and a substrate located on the first upper surface, wherein the opening of the first heat spreader is exposed.

16. The structure of claim 15, wherein the second heat spreader further comprises a first portion and a second portion, the first portion having a thickness larger than a thickness of the second portion, wherein the second portion is in contact with the first heat spreader.

17. The structure of claim 15, wherein the second heat spreader further comprises a first portion and a second portion, the first portion having a thickness smaller than a thickness of the second portion, wherein the second portion is in contact with the first heat spreader.

18. The structure of claim 2, wherein the second heat spreader further comprises a first portion and a second portion, the first portion having a thickness larger than a thickness of the second portion, wherein the second portion is in contact with the first heat spreader.

19. The structure of claim 2, wherein the second heat spreader further comprises a first portion and a second portion, the first portion having a thickness smaller than a thickness of the second portion, wherein the second portion is in contact with the first heat spreader.

20. A structure of a heat spreader substrate comprising:

a first heat spreader having a first upper surface, a first lower surface;

a second heat spreader having a second upper surface and a second lower surface, tightly attached to the first heat spreader so that a cavity opening is formed, wherein the second lower surface and the first lower surface are coplanar, the second heat spreader further comprises a first portion and a second portion, the first portion having a thickness larger than a thickness of the second portion, wherein the second portion is in contact with the first heat spreader; and a substrate located on the first upper surface, wherein the opening of the first heat spreader is exposed.

21. A structure of a heat spreader substrate comprising:

a first heat spreader having a first upper surface, a first lower surface;

a second heat spreader having a second upper surface and a second lower surface, tightly attached to the first heat spreader so that a cavity opening is formed, wherein the second lower surface and the first lower surface are coplanar, the second heat spreader further comprises a first portion and a second portion, the first portion having a thickness smaller than a thickness of the second portion, wherein the second portion is in contact with the first heat spreader; and a substrate located on the first upper surface, wherein the opening of the first heat spreader is exposed.

* * * * *